United States Patent [19]
Vargo et al.

[11] Patent Number: 6,167,060
[45] Date of Patent: Dec. 26, 2000

[54] DYNAMIC FORWARD ERROR CORRECTION ALGORITHM FOR INTERNET TELEPHONE

[75] Inventors: Mike Vargo, San Mateo; Jerry Chang, Los Altos, both of Calif.

[73] Assignee: Clarent Corporation, Redwood City, Calif.

[21] Appl. No.: 08/907,686

[22] Filed: Aug. 8, 1997

[51] Int. Cl.[7] .................................................... H04J 3/22
[52] U.S. Cl. ......................... 370/468; 370/521; 704/207
[58] Field of Search ................................. 370/521, 465, 370/352, 469, 468, 328; 379/93.01; 704/208, 500, 206, 211, 207; 709/219; 358/425

[56] References Cited

U.S. PATENT DOCUMENTS

| | | | |
|---|---|---|---|
| 5,187,591 | 2/1993 | Guy et al. | 358/425 |
| 5,533,004 | 7/1996 | Jasper et al. | 370/204 |
| 5,555,447 | 9/1996 | Kotzin et al. | 455/72 |
| 5,583,652 | 12/1996 | Ware | 366/75 |
| 5,699,369 | 12/1997 | Guha | 714/774 |
| 5,881,234 | 3/1999 | Schwob | 709/219 |
| 5,890,108 | 3/1999 | Yeldener | 704/208 |
| 5,940,479 | 8/1999 | Guy et al. | 379/93.01 |

*Primary Examiner*—Hassan Kizou
*Assistant Examiner*—John Pezzlo
*Attorney, Agent, or Firm*—Carr & Ferrell LLP

[57] ABSTRACT

An Internet telephone system architecture having low latency and permitting voice communication between telephones and computers is disclosed. The architecture permits dynamic packet-to-packet change in various factors to adjust for Internet conditions. A forward error correction algorithm provides a variable level of redundancy from zero to three in the transmission of data packets. The level of error correction redundancy, the codec selection and other factors, are dynamically changeable by a voice port to replace lost packets without interpolation and to thereby maintain the highest voice quality and data compression ratio that is consistent with the quantity of packet loss.

15 Claims, 7 Drawing Sheets

(a)

(b)

(c)

(d)

(a)

(b)

(c)

(d)

DYNAMIC FORWARD ERROR CORRECTION ALGORITHM FOR INTERNET TELEPHONE

BACKGROUND OF THE INVENTION

1. Technical Field

The present invention relates generally to an Internet telephone system operating over a Public Switched Telephone Network (PSTN), and more specifically to a dynamic error correction algorithm for creating packet redundancy to prevent the loss of information.

2. Discussion of the Prior Art

The idea of sending telephone calls over the Internet is relatively new, brought on by the desire to avoid expensive long distance telephone bills from the major telephone companies. While the concept of sending audio and video data, e.g. cable programming, over the Internet has been known since 1990, it was not until 1993 that a program called Maven was released to transmit voice data using a personal computer. In 1995, VocalTec offered a beta test version of its Windows-based Internet Telephone, and that same year DigiPhone offered a full-duplex Internet telephone system, which allows users to talk and listen simultaneously.

Several problems must be addressed to make an Internet telephone product commercially successful. One of the most important is maintaining sound quality despite dropouts or gaps caused by the Internet. The digital nature of the Internet has theoretical advantages vis-a-vis analog networks, but when the Internet is busy a caller may have difficulty getting through to another party. Moreover since the Internet is built to transfer data packets rather than continuous streams of sound, there may be delays and losses.

For a telephone call to be placed over the Internet, the analog voice information must be converted into a digital format as a series of data packets that are communicated through the Internet's web of computers, routers and servers. The maximum rate that a 28.8 kbps modem can send voice data is only 3 kbytes/second, but good voice quality requires 8 kbytes/second. Therefore, data compression algorithms are designed to prevent the customer from noticing delays between packets in the data stream.

Analog voice messages spoken by customers are digitized and then compressed by a compression/decompression ('codec') algorithm. There are at least ten different types of codecs, each designed to compress data optimally for a particular application. Some codecs use audio interpolation to fill in dropouts or gaps. Other codecs create high quality sound, but use complex algorithms that are slower to execute on a given computer. Still other codecs use faster compression algorithms, but the sound quality is not as high. Whether the speed of the compression algorithm is important for a particular application may depend on the speed of the computer executing the algorithm. Different codecs use different compression ratios to compress the data. For example, one codec might compress data by a factor of two from 8 kbytes/second to 4 kbytes/second, while another codec might compress data by a factor of five from 8 kbytes/second to 1.65 kbytes/second. Codecs exist that have data compression factors of twelve, even as high as fifty, but these require more complex mathematical algorithms and the resultant sound quality may depend on such things as the frequency and computer connection. Exemplary codecs include GSM, a European standard having a 5:1 compression ratio, and the TrueSpeech codec having a 15:1 compression ratio.

Prior art systems typically run only one codec at a time, although the codec may be specified initially by the user through adjustment of the computer settings or through selecting the codec from a file menu. Codec programs at both ends of an exchange must be able to understand each other, so compatibility between codecs may also be an issue.

Codecs do not address data dropouts or loss. Ordinarily, the Internet Protocol uses an Automatic Repeat Request (ARQ) to request retransmissions of lost messages, but voice transmission systems attempt to interpolate lost data rather than resend it.

Many prior art error detection algorithms utilize parity bits or checksums. U.S. Pat. No. 4,447,903 to Sewerinson utilizes a forward error correction algorithm in a system having two information channels, where the signal on the first channel has redundant data delayed m bits in time, and the signal on the second channel has redundant data delayed n bits in time. However, Sewerinson does not provide for changing the level of redundancy in combination with other parameters to eliminate lost data while producing speech with high quality in an Internet telephone system.

U.S. Pat. No. 5,268,908 to Glover et al discloses an on-the-fly error correction algorithm that provides triple coverage and low data delay. However, Glover et al uses parity bits to convert errors and is not concerned with transmitting audio information over an Internet system nor with optimizing the quality of speech data for different codecs.

The television and radio industries employ speech compression techniques in advertisement spots to minimize the amount of advertising time paid for by sponsors. Such techniques speed up the audio data while maintaining a constant pitch or frequency for the voiceover. U.S. Pat. No. 5,583,652 to Ware provides a technique known as time domain harmonic scaling for variable speed playback of an audio/video presentation while keeping the audio and video synchronized as well as the audio pitch undistorted. U.S. Pat. No. 5,555,447 to Kotzin et al mitigates speech loss in a communication system by buffering time-compressed speech in a FIFO until the FIFO is substantially empty. Thereupon, Kotzin et al transitions the communication system from time-compressed to normal speech.

SUMMARY OF THE INVENTION

The present invention sets forth a novel Internet telephone system architecture for providing full duplex operation with voice latency of less than 500 milliseconds, while also providing an error correction algorithm to fill in dropouts of lost voice data. The error correction algorithm replicates data packets in paired, tripled, or quadrupled sets at one, two, or three packet intervals, which permits the system to recreate voice data lost in up to three consecutive packets.

Another feature of the invention is that the architecture enables a dynamic change of codecs from packet-to-packet in one stream of voice data to adapt to changing network conditions. The architecture permits a dynamic change of codecs in combination with changing other factors including the level of redundancy of the error correction, the packet size and packet bundling. The architecture thereby seeks to attain the best speech quality and lowest latency given the level of data loss over the Internet detected by the system.

The system architecture includes a gateway server providing a plurality of connections between public switched telephone networks (PSTN) and the Internet. As a result, the server supports both telephone-to-telephone connections and PC-to-telephone connections. An account manager provides monitoring and billing functions.

The gateway server includes hardware allowing respective Internet and PSTN connections, and software for providing the connections themselves. The software architecture includes the transport, the telephone port, or "teleport," and the session. The transport creates a session upon receiving a call incoming from the Internet, and the session manages the network communication between communication endpoints and establishes identifiers or labels to indicate these endpoints. The software also includes a voice port, the wave port and a line port. The voice port executes the forward error correction algorithm, dynamically selects a codec, and frames and aligns the data packets.

A further feature of the invention is a technique for eliminating dead air space in the data stream by speeding up or slowing down the data from the buffer while maintaining a constant voice pitch.

DETAILED DESCRIPTION OF THE PREFERRED EMBODIMENTS

Figure 1:
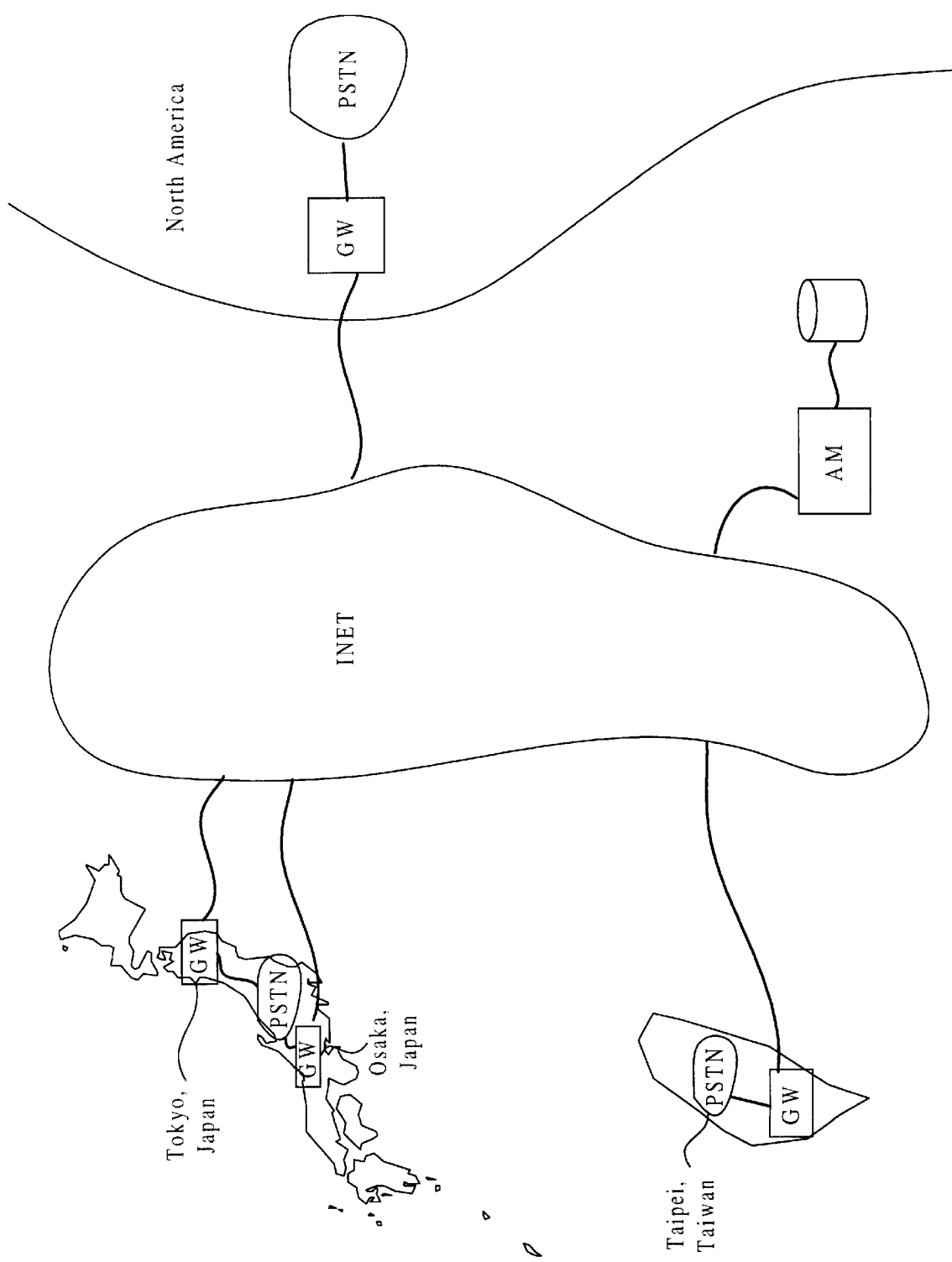
FIG. 1 shows an overview of an Internet telephone system according to the present invention.

FIG. 1 illustrates in general overview the operation of the Internet telephone system of the present invention. A call is initiated in North America over a PSTN gateway server. The server supports either telephone to telephone conversations or PC to telephone connections. FIG. 1 shows possible connections over the Internet from North America to Tokyo Japan, Osaka Japan and Taipei Taiwan. In each of these cities, a PSTN gateway server is connected to the Internet to receive calls. An account manager (AM) provides billing, monitoring and authentication of these telephone services for up to 25 Servers. The account manager interacts with a relational database, and is an intelligent network or service control point. The account manager can be attached at any point on the network.

Figure 2:
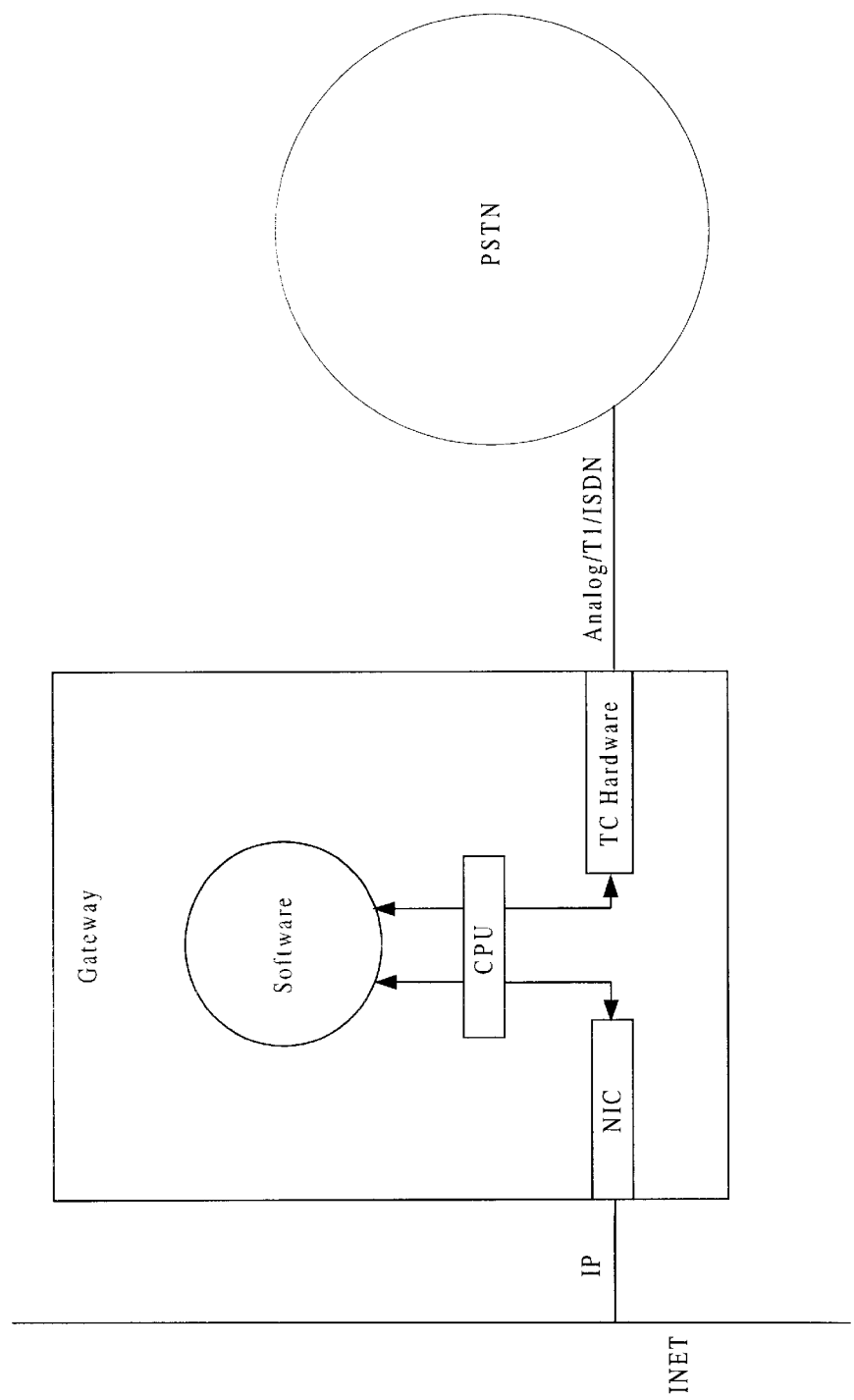
FIG. 2 details the main features of the gateway server of FIG. 1.

Referring to FIG. 2, each of the PSTN gateway servers consists of a public switched telephone network and a gateway. Each gateway consists of a central processing unit (CPU), the Windows ® Operating System (OS), gateway software, telecommunications hardware (preferably Natural Microsystems) and a Network Interface Card (NIC) connected by a bus. The Gateway operates on a "Wintel" platform, preferably with Windows® NT 4.0. The telecommunications hardware supports analog, T1 or Integrated Services Digital Network (ISDN) connections to the PSTN, and the gateway's NIC supports an Internet Protocol (IP) such as TCP (Transmission Control Protocol) or UDP (User Datagram Protocol) connection to the Internet.

Figure 3:
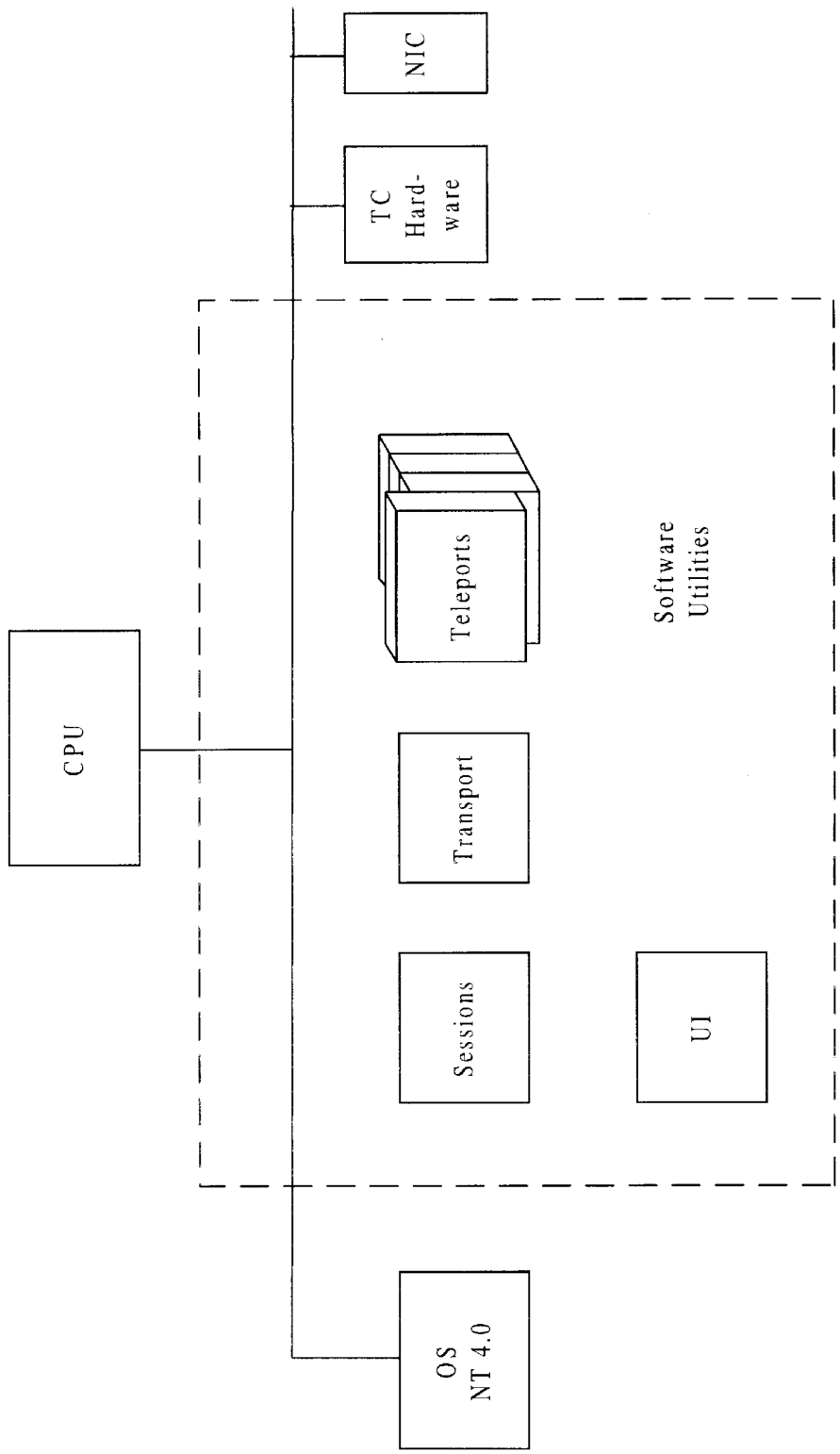
FIG. 3 shows gateway server features in still more specific detail, with an emphasis on the software modules.

FIG. 3 shows the gateway server software utilities which include modules called sessions and transport, a plurality of teleports and a User Interface (UI).

Turning now to a general description of how the FIGS. 2 and 3 gateway server operates, assume there is a call incoming from the PSTN. This incoming call signals arrive at to the software of the gateway server. Associated with each audio port of the gateway server is an object port, called a telephone port, or teleport, FIG. 4, that waits for an incoming call. On the Internet side of the gateway, there is another object called the transport. Between the teleports and the transport is an object called the sessions, which joins the ports on one gateway to ports on another gateway. The session is the communication mechanism between teleports, and has two functions: (1) managing IP network communication between the incoming and outgoing ends of the server, and (2) providing labeling and identifiers to indicate the conversation endpoint.

The sessions finds an available connection such that an incoming call from the telephone line is joined to an outgoing message on the Internet. Similarly, if an incoming call arrives from the Internet, this call is received by the transport at the ingress side of the server and the session links this call on the egress side to a teleport to produce an outgoing call on the PSTN.

The gateway server has various software objects associated with the teleport and the transport. For example, a teleport has an echo suppressor for voice data and also an encapsulating algorithm, to be discussed below. The transport contains similar software for data filtering and correction.

Figure 5:
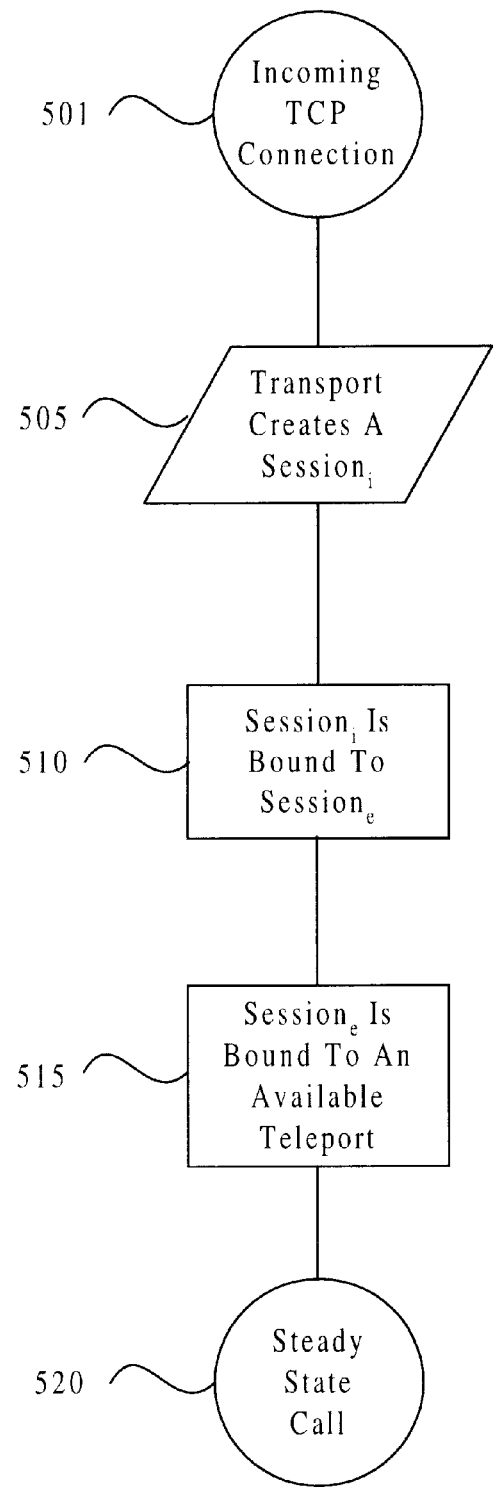
FIG. 5 is a flowchart of steps in connecting a call.

FIG. 5 shows a flowchart of the gateway software process for handling an outgoing (egress) call setup to illustrate the operation of the transport. Beginning in step 501, an incoming call is input to the transport, which listens for incoming TCP connections. In step 505, the transport creates an incoming session, session$_i$, and in step 510, this session is bound to an outgoing or egress session, session$_e$, on the remote side of the gateway. Then, in step 515, session$_e$ is bound to an available telephone port on the outbound side of the server. The last step 520 in the flowchart shows a steady state condition where the call has been set up with a pair of ports talking to one another.

The gateway server of the present invention supports both telephone to telephone conversations as well as PC to telephone conversations. Each server can accommodate up to 24 simultaneous conversations. High quality voice communication is established with low latency. The latency from mouth to ear is less than 500 milliseconds. The gateway system includes 10 Base T or 100 Base T network connections, and captures Dual Tone Multifrequency (DTMF) tones from end users.

The teleport supports up to 16 different codec algorithms for speech. A codec is a hardware or software mechanism for converting analog voice signals to digital signals and encoding the digital signals, and vice-versa. The teleport is designed to be able to switch codec between one data packet and the next in the same data stream. Each data packet constitute a self-describing package.

Figure 4:
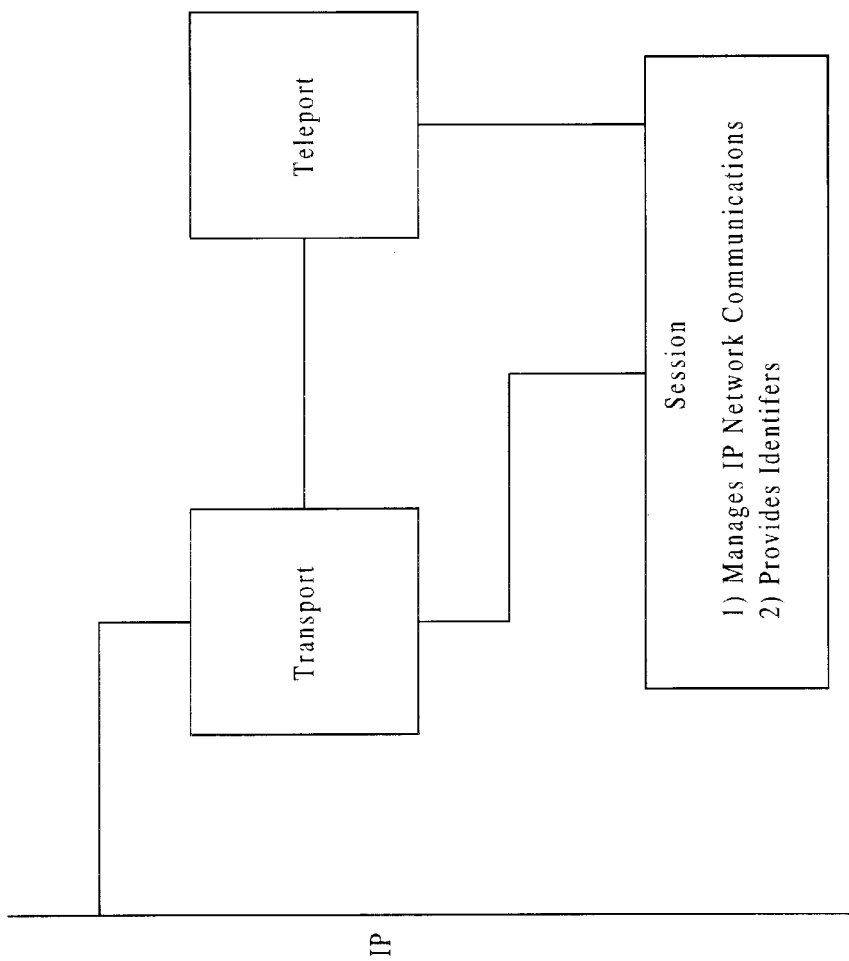
FIG. 4 shows the operation of these software modules in establishing a call connection.
Figure 6:
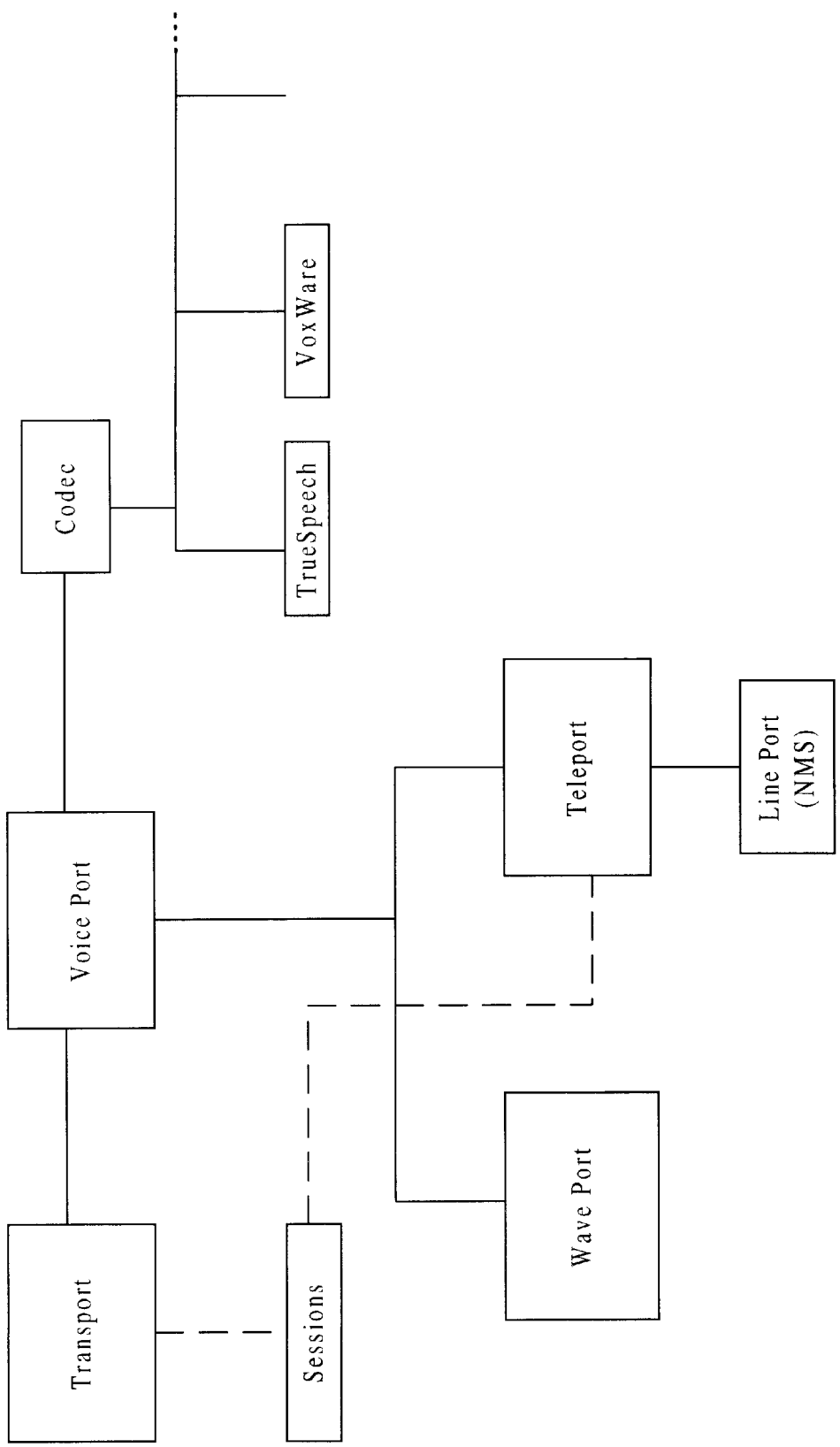
FIG. 6 shows the software modules of the gateway server in further detail.

FIG. 6 is a system architectural diagram of FIG. 4 in further detail. The voice port receives incoming data packets from the transport. Each transport has many voice ports. The voice port has derived classes of the wave port, which contains multimedia Application Program Interfaces (API's), and the teleport. The voice port contains the codec algorithms. Among the different varieties of codec are the TrueSpeech algorithm, Vox Ware, the null speech algorithm and others.

The voice port is responsible for three functions. First, it provides forward error correction. Second, it provides the codec algorithm for sending and regenerating speech. And third, it provides for alignment and framing of data packets within the buffer.

An important focus of the present invention is the particular forward error correction algorithm for providing packet redundancy. The basic problem is how to correct for certain packets of voice information being lost as they are transported across the Internet. Prior art approaches used interpolation to deal with lost packets. In the present invention, lost data packets can be recovered because these packets are duplicated downstream.

Packet redundancy effectively slows the information transmission rate because, due to replication, the information density is not as high. A packet with a redundancy of level one is twice as long as a packet with a redundancy of level zero, and a packet with a redundancy of level two is three times as long as a packet with a redundancy of level zero. Changing the packet redundancy in some ways has the same effect as the known technique of changing the packet size or packet bundling, since a different length is assigned to the data stream. But while changing the packet size or bundling puts more information in each packet, changing the packet redundancy does not. Still, even at the expense of transmission capacity, it is advantageous to provide redundancy in the data stream to eliminate voice nulls due to lost data, or dropouts, and thereby improve voice quality. Thus, a certain amount of transmission capacity is sacrificed for the overall success and integrity of the voice transmission.

The level of data redundancy for the error correction algorithm of the invention is between zero and three. That is, the data is replicated in zero to three subsequent packets of the message. The data stream of the message is sequenced, and it is important to keep the sequence intact. When the forward error correction algorithm is enabled, each data packet is compared to the previous data packet to determine whether there is a voice null or gap in the sequence. In the limiting case where the error correction algorithm is not enabled, the level of redundancy is zero. If the error correction algorithm is enabled and a voice null or gap is detected in the sequence, then the algorithm regenerates the lost packet through comparing the sequence numbers of the received packets for redundant data.

As a general principle, the three level fault tolerance is designed for marginal networks and can accommodate up to four consecutive dropped packets. The number of dropped packets varies according to a Poisson or similar type of statistical distribution (e.g. Pareto), with the majority of consecutive packet losses being in the range of one to four, with few consecutive packet losses in the tails of the distribution, i.e. numbering more than four consecutive losses.

Figure 7:
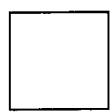
FIGS. 7(a) to (d) illustrate the operation of the forward error correction algorithm of the present invention.
Figure 7:
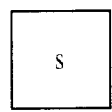
Figure 7:
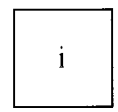
Figure 7:
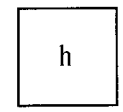
Figure 7:
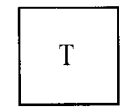
Figure 7:
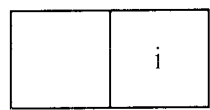
Figure 7:
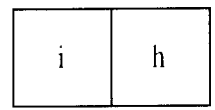
Figure 7:
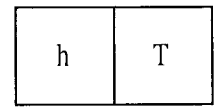
Figure 7:
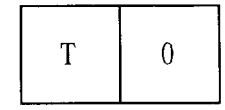
Figure 7:
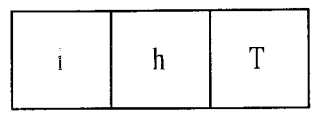
Figure 7:
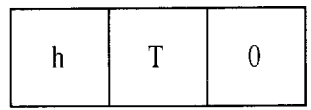
Figure 7:
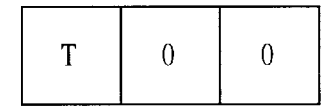
Figure 7:
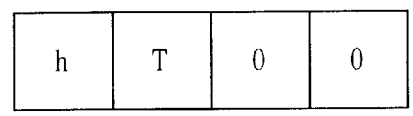
Figure 7:
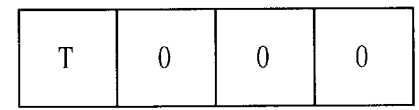

The particular error correction algorithm of the invention is described in FIGS. 7(a) to 7(d). In these examples, each box is assumed to be essentially one data packet, but for purposes of illustration each of these packets is illustrated as a letter of the alphabet. The grouping of data packets in pairs, triplets or quadruplets in FIGS. 7(a) to 7(d) is for purposes of illustration only; the data stream is continuous without spaces between the groupings. In FIG. 7(a), the data stream is illustrated as "This is a sentence." The data stream is propagating from left to right in the drawing, so that the "T" comes first, then the "h," then the "i," et cetera.

FIG. 7(b) shows the encoding scheme for error correction with a redundancy of level one. Conceptually, the data stream is arranged as a series of pairs of data packets. The last data packet of each pair is repeated as the first data packet of the next pair. Symbolically, for each packet N, $N_{last} \rightarrow N_{fir}+1$. The first packet of the first pair is initialized with a null value to protect against loss of the first data packet. Level one redundancy translates this into duplicated data packet pairs of "ØT", "Th", "hi", "is", and so on.

FIG. 7(c) illustrates the error correction algorithm of the invention when the level of redundancy is two. Here, data packets are arranged in triplets. The algorithm is constructed such that the last packet of the first triplet becomes the middle packet of the next triplet, and the middle packet of the first triplet becomes the first packet of the next triplet. Symbolically, $N_{mid} \rightarrow N_{fir}+2$, and $N_{last} \rightarrow N_{mid}+2$. As before, the packets are initialized with nulls to permit redundancy for the beginning packets in the data stream. Since the packets are in triplets, there must be nulls for the first two packets of the first triplet. Therefore, the data stream "This is a sentence." is replicated as "ØØT", "ØTh", "Thi", "his," et cetera. Each new triplet loses the first packet of the previous triplet.

FIG. 7(d) illustrates the error correction scheme for redundancy of level three. Here, the data packets are arranged in quadruplets. The algorithm is constructed such that the second packet in the first quadruplet is mapped to the first packet in the second quadruplet; the third packet in the first quadruplet is mapped to the second packet in the second quadruplet; and the fourth packet in the first quadruplet is mapped to the third packet in the second quadruplet; the first packet in the first quadruplet is not repeated in the next quadruplet. Symbolically, $N_{sec} \rightarrow N_{fir}+3$; $N_{thr} \rightarrow N_{sec}+3$ and $N_{four} \rightarrow N_{thr}+3$. In order to prevent the loss of first three data packets, a series of nulls is added to the first three data packets. The first quadruplet is initiated with three nulls, and these nulls are transformed by the algorithm into two nulls in the second quadruplet and one null on the third quadruplet.

More generally, for a redundancy of level k, for k=0 to L, the algorithm provides that the $i^{th}$ data packet is repeated k times at positions (i+j*k)) for j=1 to k.

One important feature of the forward error correction algorithm of the invention is that the level of redundancy can be dynamically varied from packet-to-packet within a data stream. For example, one group of packets can have a level one redundancy, the next group of packets can have a level three redundancy, and the following group of packets can have a level zero redundancy. Selecting the level of redundancy is one of the features performed by the voice port. Level three redundancy can sustain three consecutive packets losses by the Internet without the listener noticing a loss.

Instead of changing the packet redundancy, the voice port can also dynamically vary the packet size or bundling. The packet size may initially be 67 bytes, with 64 bytes of information and a 3 byte header. The packet bundling may be changing by bundling two 64 byte packets together with a 3 byte header to give a 131 byte packet. Or, the packet size could be changed from 64 bytes to 32 bytes of information to give a 35 byte packet, including a 3 byte header. Both the packet size and packet bundling can be changed by the voice port from packet-to-packet in the data stream to accommodate the loss characteristics of the Internet at that particular time.

Furthermore, not only does the voice port have the capability of dynamically changing the redundancy, packet size and packet bundling from packet to packet, but also the voice port can similarly vary the codec algorithm from packet-to-packet. The packet is given self-describing information about what type of codec is needed at the receiver to decompress the packet. The choice of codec at the transmitter may be derived from a complex function depending on the choices of packet redundancy, packet size and packet bundling.

The voice port can thus dynamically pick the speech compression algorithm, the data packet size, and the type of forward error correction to adapt to network conditions. A complex feedback algorithm describes the various conditions under which the voice port adjusts these variables. The voice port can also select from several qualities of codec in response to possible conditions presented by the network.

Generally speaking, the voice port increases the packet redundancy when it detects a loss of information, and this implies that less information will be propagating in a given packet stream. To accommodate the same quantity of information through the limited bandwidth of a modem, speech quality must be sacrificed. Therefore, a faster but lower speech quality codec algorithm is simultaneously implemented. The result is that the loss of data packets is compensated by the redundancy.

As an example, assume the voice port begins with the TrueSpeech codec algorithm, which encodes speech at an 8.5 kbytes/second and with no redundancy. After noticing dropped packets, the voice port adjusts by selecting the Vox Ware 2.9 kbytes/second algorithm having somewhat lower sound quality, but with two level redundancy error correction. Double redundancy Vox Ware includes two 2.9 kbytes/second algorithms, which is still approximately 6 kbytes/second. Thus, it is possible to change the redundancy and the codec to correct for dropped packets and utilize the same amount of Internet bandwidth. Fault tolerance in the voice transmission data is thereby achieved.

It is also possible to vary the size of the individual packets or to vary the bundling of the packets by techniques that are well known in the art. The voice port is tolerant of faults in the data stream, while the standard procedure for Transmission Control Protocol (TCP) on the Internet is to request a retransmission of the data.

Another important characteristic of the voice port is that it permits codec encapsulation so that the higher level software is functionally independent of the lower level codec software. The codecs are therefore essentially objects and neither the transport nor any of the other software needs to be compatible with any particular codec. As new codecs are introduced, they can be added easily without requiring modifications in the higher level system software.

An alternate embodiment of the invention adjusts for dead time in a speech message by time warping the speech at a constant pitch. Generally, once the integrity of the data stream is guaranteed by the error correction algorithm, at least part of the data stream waits in a buffer on the receiving side of the server until it is emptied to the receiver. However, when there is no data left in the buffer, there is a danger that dead air time can occur, in which the listener hears a gap or blank in the transmission. Therefore, the software further contains a utility that senses when the data buffer becomes depleted, and stretches the data reaching the ear of the listener in a manner opposite to the technique utilized in television commercials and radio voiceovers to speed up the data rate. Effectively, the algorithm contains a lever that measures the number of packets in the buffer, and, without changing the pitch, speeds up or slows down the data rate corresponding to the pool depth. The Vox Ware codec particularly supports this algorithm to specify the degree of time warp.

The invention has been described in general terms according to the preferred embodiments. However, those of ordinary skill in the art will understand that certain modifications or changes may be made to the disclosed embodiment without departing from the essential nature of the invention. Therefore, the scope of the invention is to be limited only by the following claims.

What is claimed is:

1. A system architecture for an internet telephone gateway server, comprising:

hardware for interfacing with the internet and a public switched telephone network; and software for connecting telephone calls between transmitters and receivers, said software having the capability of dynamically changing a level of redundancy of a forward error correction algorithm from packet-to-packet in a data stream so as to accommodate data dropouts;

wherein said level of redundancy varies between k=0 and M, and an $i^{th}$ data packet repeats k times at positions $(i+(j*k))$ for j=1 to k.

2. The system architecture of claim 1, wherein:

$M=3$.

3. The system architecture of claim 1, wherein the repetition of the $i^{th}$ data packet includes less than the whole $i^{th}$ data packet.

4. A method for filling dead space in an Internet telephone communication, comprising the steps of:

detecting a quantity of voice data waiting in a voice input buffer;

regulating from a first speed to a second speed the rate of removal of said voice data from said buffer based upon said quantity; and maintaining a constant pitch for said voice data as heard by a listener as the rate changes from said first speed to said second speed.

5. The method of claim 4, wherein said regulating step further comprises:

slowing down the rate of removal of said voice data for low quantities; and speeding up the rate of removal for high quantities.

6. A system for filling dead space in an Internet telephone communication, comprising:

means for detecting a quantity of voice data waiting in a voice input buffer;

means for regulating from a first speed to a second speed the rate of removal of said voice data from said buffer based upon said quantity; and means for maintaining a constant pitch for said voice data as heard by a listener as the rate changes from said first speed to said second speed.

7. The system of claim 6, wherein:

said means for regulating slows down the rate of removal of said voice data for low quantities of said data in said buffer and speeds up the rate of removal for high quantities.

8. A method for eliminating packet losses in an Internet telephone communication, comprising the steps of:

receiving an Internet telephone call from a personal computer or a telephone;

digitizing said telephone call into a digital data stream;

determining a first level of redundancy of a forward error correction algorithm based upon Internet conditions;

applying said first level of redundancy to a first part of said digital data stream;

determining a second level of redundancy of said forward error correction algorithm based upon Internet conditions;

applying said second level of redundancy to a second part of said digital data stream; and detecting a quantity of voice data waiting in a voice input buffer;

regulating the rate of removal of said voice data from said buffer based upon said quantity from a first speed to a second speed; and maintaining a constant pitch for said voice data as heard by a listener as the rate changes from said first speed to said second speed.

9. A method for eliminating packet losses in an Internet telephone communication, comprising the steps of:

receiving an Internet telephone call from a personal computer or a telephone;

digitizing said telephone call into a digital data stream; and dynamically applying to said data stream a varying level of redundancy of a forward error correction algorithm based upon Internet conditions;

wherein said varying level of redundancy comprises a combination of a level one redundancy, a level two redundancy, and a level three redundancy.

10. The method of claim 9, further comprising the steps of:

detecting a quantity of voice data waiting in a voice input buffer;

regulating the rate of removal of said voice data from said buffer based upon said quantity from a first speed to a second speed; and maintaining a constant pitch for said voice data as heard by a caller as the rate changes from said first speed to said second speed.

11. The method of claim 9 wherein:

in said level one redundancy, said data stream is arranged as a series of pairs of data packets and the last packet of each pair is repeated as the first packet of the next pair;

in said level two redundancy, data packets are arranged in triplets, the last packet of a first triplet is mapped to the middle packet of a second triplet, and the middle packet of the first triplet is mapped to the first packet of the second triplet; and in said level three redundancy, data packets are arranged in quadruplets, the second packet in a first quadruplet is mapped to the first packet in a second quadruplet, the third packet in the first quadruplet is mapped to the second packet in the second quadruplet, and the fourth packet in the first quadruplet is mapped to the third packet in the second quadruplet.

12. A method for eliminating packet losses in an Internet telephone communication, comprising the steps of:

receiving an Internet telephone call from a personal computer or a telephone;

digitizing said telephone call into a digital data stream;

determining a first level of redundancy of a forward error correction algorithm based upon Internet conditions;

applying said first level of redundancy to a first part of said digital data stream;

determining a second level of redundancy of said forward error correction algorithm based upon Internet conditions;

applying said second level of redundancy to a second part of said digital data stream; and using a level one redundancy in which said data stream is arranged as a series of pairs of data packets and the last packet of each pair is repeated as the first packet of the next pair.

13. A method for eliminating packet losses in an Internet telephone communication, comprising the steps of:

receiving an Internet telephone call from a personal computer or a telephone;

digitizing said telephone call into a digital data stream;

determining a first level of redundancy of a forward error correction algorithm based upon Internet conditions;

applying said first level of redundancy to a first part of said digital data stream;

determining a second level of redundancy of said forward error correction algorithm based upon Internet conditions;

applying said second level of redundancy to a second part of said digital data stream; and using a level two redundancy in which data packets are arranged in triplets, the last packet of a first triplet becomes the middle packet of a second triplet, and the middle packet of the first triplet becomes the first packet of the second triplet.

14. A method for eliminating packet losses in an Internet telephone communication, comprising the steps of:

receiving an Internet telephone call from a personal computer or a telephone;

digitizing said telephone call into a digital data stream;

determining a first level of redundancy of a forward error correction algorithm based upon Internet conditions;

applying said first level of redundancy to a first part of said digital data stream;

determining a second level of redundancy of said forward error correction algorithm based upon Internet conditions;

applying said second level of redundancy to a second part of said digital data stream; and using a level three redundancy in which data packets are arranged in quadruplets, the second packet in a first quadruplet is mapped to the first packet in a second quadruplet, the third packet in the first quadruplet is mapped to the second packet in the second quadruplet, and the fourth packet in the first quadruplet is mapped to the third packet in the second quadruplet.

15. A method for eliminating packet losses in an Internet telephone communication, comprising the steps of:

receiving an Internet telephone call from a personal computer or a telephone;

digitizing said telephone call into a digital data stream;

determining a level of redundancy of a forward error correction algorithm based upon Internet conditions, the level of redundancy varying between k=0 and M, wherein M is greater than or equal to 1; and applying said level of redundancy to a part of said digital data stream;

wherein an $i^{th}$ data packet is repeated k times in said digital data stream;

whereby aural data in the $i^{th}$ data packet is duplicated to maintain the voice quality present prior to the packet loss.

* * * * *